United States Patent
Lim et al.

(10) Patent No.: US 7,397,715 B2
(45) Date of Patent: Jul. 8, 2008

(54) SEMICONDUCTOR MEMORY DEVICE FOR TESTING REDUNDANCY CELLS

(75) Inventors: Jong-Hyoung Lim, Hwaseong-si (KR); Sang-Man Byun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 11/450,318

(22) Filed: Jun. 9, 2006

(65) Prior Publication Data

US 2007/0086252 A1   Apr. 19, 2007

(30) Foreign Application Priority Data

Oct. 19, 2005   (KR) ...................... 10-2005-0098719

(51) Int. Cl.
*G11C 7/00*   (2006.01)
*G11C 29/00*  (2006.01)
*G11C 8/10*   (2006.01)

(52) U.S. Cl. .................. 365/201; 365/200; 365/203; 365/230.06

(58) Field of Classification Search ................. 365/200, 365/201, 185.09, 203
See application file for complete search history.

(56) References Cited

U.S. PATENT DOCUMENTS

| | | | | |
|---|---|---|---|---|
| 5,652,725 A | * | 7/1997 | Suma et al. ................. | 365/200 |
| 5,898,627 A | * | 4/1999 | Yoshikawa ................... | 365/200 |
| 6,396,750 B2 | * | 5/2002 | Honigschmid et al. ...... | 365/200 |
| 6,603,689 B2 | * | 8/2003 | Kato et al. .................. | 365/200 |
| 6,640,321 B1 | * | 10/2003 | Huang et al. ................ | 714/720 |
| 6,847,563 B2 | * | 1/2005 | Koshikawa .................. | 365/200 |
| 7,212,455 B2 | * | 5/2007 | Kuroki ......................... | 365/200 |
| 2003/0039157 A1 | * | 2/2003 | Bohm et al. ................. | 365/200 |

FOREIGN PATENT DOCUMENTS

| | | |
|---|---|---|
| JP | 05-054690 | 3/1993 |
| JP | 11-242896 | 9/1999 |
| KR | 10-1998-0034257 | 8/1998 |
| KR | 10-2000-0004714 | 1/2000 |

\* cited by examiner

*Primary Examiner*—Huan Hoang
*Assistant Examiner*—Michael J Weinberg
(74) *Attorney, Agent, or Firm*—Mills & Onello LLP

(57) ABSTRACT

Provided is a semiconductor memory device. The semiconductor memory device includes: a memory cell array including regular cells; a redundancy memory cell array including redundancy cells for substituting for defective regular cells; a command decoder for generating an operation mode selection signal in response to command signals; a redundancy cell test controller for generating a test operation control signal and transmitting address signals in response to the operation mode selection signal; and a redundancy decoder for decoding the address signals to select the redundancy cells in response to the test operation control signal. All redundancy cells can be selected and tested based on the external command signal and the address signal, and thus it is possible to check all redundancy cells for defects in advance even after the semiconductor memory device is packaged, and to enable only non-defective redundancy cells to be substituted for defective regular cells. This increases the reliability of a repair operation.

21 Claims, 6 Drawing Sheets

SEMICONDUCTOR MEMORY DEVICE FOR TESTING REDUNDANCY CELLS

CROSS-REFERENCE TO RELATED APPLICATION

This application claims the benefit of Korean Patent Application No. 10-2005-0098719, filed Oct. 19, 2005, the contents of which are hereby incorporated herein by reference in their entirety.

BACKGROUND OF THE INVENTION

1. Field of the Invention

The present invention relates to a semiconductor memory device, and more particularly, to a semiconductor memory device which allows for testing all redundancy cells.

2. Description of the Related Art

A semiconductor memory device includes regular cells and corresponding redundancy cells. The redundancy cells are adapted to be substituted for defective regular cells and thus increase the yield in fabricating memory devices.

As the process of fabricating semiconductor memory devices becomes more complicated, cell defect rate increases. Accordingly, the probability of redundancy cells being substituted for the defective regular cells increases. Thus, it is increasingly important to check all redundancy cells for defects.

To guarantee the quality of redundancy cells, the redundancy cells are tested at the same level as regular cells. In particular, for post-package repair methods, the redundancy cells are substituted for the regular cells even after a wafer is packaged, as well as after the wafer is tested. Thus, it is necessary to test all redundancy cells even after packaging completion in order to check the quality of the device.

However, conventional semiconductor memory devices only allow for testing fuse-programmed redundancy cells by a fuse programming circuit, not non-fuse-programmed redundancy cells. Consequently, it is impossible to test all the redundancy cells of conventional semiconductor memory devices. FIG. 1 illustrates the configuration of a conventional semiconductor memory device.

Referring to FIG. 1, the semiconductor memory device includes a memory cell array 11, a redundancy memory cell array 12, a pre row decoder 13, a row decoder 14, a pre column decoder 15, a column decoder 16, a row fuse controller 17, and a redundancy row decoder 18.

The memory cell array 11 includes a plurality of regular cells. Data is written/read to/from regular cells selected by word line enable signals from the row decoder 14 and column selection signals from the column decoder 16.

The redundancy memory cell array 12 includes a plurality of redundancy cells corresponding respectively to the plurality of regular cells in the memory cell array 11. Data is written/read to/from redundancy cells selected by word line enable signals from the redundancy row decoder 18 and column selection signals from the column decoder 16.

The pre row decoder 13 pre-decodes a plurality of row address signals RAab to generate a plurality of pre-decoded row address signals PRAcd. The row decoder 14 is enabled when it does not receive a row repair signal repair_R, and decodes the plurality of pre-decoded row address signals PRAcd to generate the word line enable signals for selecting regular cells included in the memory cell array 11.

The pre column decoder 15 pre-decodes a plurality of column address signals CAgh to generate a plurality of pre-decoded column address signals PCAij. The column decoder 16 decodes the plurality of pre-decoded column address signals PCAij to generate column selection signals for selecting the regular cells or the redundancy cells.

The row fuse controller 17 programs a plurality of fuses according to row addresses of defective regular cells (hereinafter, referred to as "defective cells"), which are identified in wafer testing and post-packaging testing. When addresses indicated by the input pre-decoded row address signals PRAcd match programmed row addresses, the row fuse controller 17 generates a row repair signal repair_R for enabling repair operation and row fuse signals RFef for selecting redundancy cells to be substituted for defective cells.

In this case, a plurality of fuses in the row fuse controller 17 may be implemented by laser beam-cut laser fuses or electrically cut electric fuses. Each of the plurality of fuses is selectively cut to be programmed.

The redundancy row decoder 18 is enabled when receiving the row repair signal repair_R and decodes a plurality of row fuse signals RFef to generate word line enable signals for selecting redundancy cells in the row redundancy memory cell array 12.

Hereinafter, operation of the semiconductor memory device will be described with reference to FIG. 1.

It is assumed that row addresses of defective cells are programmed in the row fuse controller 17 and row addresses RAab for selecting programmed row addresses are input from the exterior.

When receiving the plurality of row addresses RAab, the pre row decoder 13 generates a plurality of decoded row addresses DRAcd. When receiving the decoded row addresses PRAcd for selecting the programmed row address, the row fuse controller 17 generates a row repair signal repair_R for enabling repair operation and row fuse signals RFef for selecting redundancy cells to be substituted for defective cells.

The row decoder 14 is disabled in response to the row repair signal repair_R, and the redundancy row decoder 18 generates word line select signals for selecting redundancy cells to be substituted for defective cells in response to the row repair signal repair_R and the row fuse signals RFef.

Accordingly, the redundancy memory cell array 12 selects the redundancy cell in response to the word line select signals from the row decoder 14 and the column selection signal from the column decoder 16.

In order to test the selected redundancy cell in the semiconductor memory device, electric stress is applied to the selected redundancy cell or an active operation (e.g., read or write operation) is performed through the selected redundancy cell.

As such, since the conventional semiconductor memory device has no means for selecting a redundancy cell to be tested, only redundancy cells selectable through fuse programming are selected and tested.

In this manner, it is only possible to check whether any fuse-programmed redundancy cells are defective, but not non-fuse-programmed redundancy cells.

Consequently, in the conventional semiconductor memory device, a defective redundancy cell may be substituted for another defective cell, which significantly degrades reliability of the repair operation.

SUMMARY OF THE INVENTION

Embodiments of the invention provide a semiconductor memory device that allows for testing all redundancy cells using an external command signal and an address signal.

In one aspect, the invention is directed to a semiconductor memory device. The semiconductor memory device includes: a memory cell array including regular cells; a redundancy memory cell array including redundancy cells for substituting for defective regular cells; a command decoder for generating an operation mode selection signal in response to command signals; a redundancy cell test controller for generating a test operation control signal and transmitting address signals in response to the operation mode selection signal; and a redundancy decoder for decoding the address signals to select the redundancy cells in response to the test operation control signal.

The redundancy cell test controller may include a test operation controller for generating the test operation control signal when the same operation mode selection signal is consecutively received and terminating the generation of the test operation control signal when the same operation mode selection signal is received once more upon generating the test operation control signal; and an address signal transmitting unit for transmitting the address signals when the test operation control signal is received.

The test operation controller may include a test operation request sensing unit for generating a first signal when consecutive reception of the same operation mode selection signal is sensed; a test operation termination request sensing unit for generating a second signal when the same operation mode selection signal is consecutively received and then sensing once more reception of the same operation mode selection signal; and a test operation control signal generator for generating the test operation control signal when the first signal is received and ceasing to generate the test operation control signal when the second signal is received.

In one embodiment, the test operation request sensing unit comprises: first and second flip-flops for outputting the operation mode selection signal synchronized with a clock signal; a third flip-flop for outputting the second flip-flop output signal synchronized with the clock signal; a first logic gate for performing an AND operation on the output signals of the first and third flip-flops; a second logic gate for performing an AND operation on an output signal of the first logic gate and the operation mode selection signal; first delay means for delaying an output signal of the second logic gate; and a fourth flip-flop for outputting the output signal of the first logic gate synchronized with the output signal of the first delay means.

In one embodiment, the test operation termination request sensing unit comprises: a first inverter for inverting the output signal of the first logic gate; a third logic gate for performing an AND operation on the operation mode selection signal, an output signal of the first flip-flop, an output signal of the first inverter, and an output signal of the fourth flip-flop; second delay means for delaying the clock signal; a fourth logic gate for performing an AND operation on the operation mode selection signal and an output signal of the second delay means; and a fifth flip-flop for outputting an output signal of the third logic gate synchronized with an output signal of the fourth logic gate.

In one embodiment, the test operation control signal generator comprises: a second inverter for inverting the output signal of the fourth flip-flop; and a fifth logic gate for performing a NOR operation on an output signal of the fifth flip-flop and an output signal of the second inverter to generate a test operation control signal.

In one embodiment, the operation mode selection signal enables a precharge operation to be performed. In one embodiment, the command decoder decodes command signals for requesting the precharge operation to generate the operation mode selection signal enabling the precharge operation to be performed.

In one embodiment, the semiconductor memory device comprises: a fuse controller for programming addresses of the defective regular cells and generating a repair signal and fuse signals when addresses indicated by the address signals match the fuse-programmed addresses; and a switch for transmitting the address signals or the fuse signals in response to the test operation control signal.

In one embodiment, the redundancy decoder further comprises a function of decoding the fuse signals to select the redundancy cells in response to the repair signal.

In another aspect, the invention is directed to a semiconductor memory device. The semiconductor memory device includes: a memory cell array including regular cells; a redundancy memory cell array including first and second redundancy cells for substituting for defective regular cells; a command decoder for generating an operation mode selection signal in response to command signals; a redundancy cell test controller for transmitting address signals in response to the operation mode selection signal and a test mode selection signal, when a row or column test operation control signal is generated; a row redundancy decoder for decoding the address signals to select the first redundancy cells in response to the row test operation control signal; and a column redundancy decoder for decoding the address signals to select the second redundancy cells in response to the column test operation control signal.

The test mode selection signal may be one of the address signals, and may include information for selecting redundancy cells to be tested from the first and second redundancy cells. The redundancy cell test controller may include: a test operation controller for generating the row test operation control signal or the column test operation control signal in response to the operation mode selection signal and the test mode selection signal; a row address signal transmitting unit for transmitting the address signals in response to the row test operation control signal; and a column address signal transmitting unit for transmitting the address signals in response to the column test operation control signal.

The test operation controller may include an integrated test operation controller for generating the test operation control signal when the same operation mode selection signal is consecutively received, and terminating generating the test operation control signal when the same operation mode selection signal is received once more upon generating the test operation control signal; and a row and column test operation control signal generator for generating the row test operation control signal at a first state of the test mode selection signal and the column test operation control signal at a second state of the test mode selection signal when the test operation control signal is generated.

The integrated test operation controller may include a test operation request sensing unit for generating a first signal when consecutive reception of the same operation mode selection signal is sensed; a test operation termination request sensing unit for generating a second signal when the same operation mode selection signal is consecutively received and then sensing once more reception of the same operation mode selection signal; and a test operation control signal generator for generating the test operation control signal when the first signal is received and ceasing to generate the test operation control signal when the second signal is received.

In one embodiment, the test operation request sensing unit comprises: first and second flip-flops for outputting the operation mode selection signal synchronized with a clock signal;

a third flip-flop for outputting the second flip-flop output signal synchronized with the clock signal; a first logic gate for performing an AND operation on the output signals of the first and third flip-flops; a second logic gate for performing an AND operation on an output signal of the first logic gate and the operation mode selection signal; first delay means for delaying an output signal of the second logic gate; and a fourth flip-flop for outputting the output signal of the first logic gate synchronized with the output signal of the first delay means.

In one embodiment, the test operation termination request sensing unit comprises: a first inverter for inverting the output signal of the first logic gate; a third logic gate for performing an AND operation on the operation mode selection signal, an output signal of the first flip-flop, an output signal of the first inverter, and an output signal of the fourth flip-flop; second delay means for delaying the clock signal; a fourth logic gate for performing an AND operation on the operation mode selection signal and an output signal of the second delay means; and a fifth flip-flop for outputting an output signal of the third logic gate synchronized with an output signal of the fourth logic gate.

In one embodiment, the test operation control signal generator comprises: a second inverter for inverting the output signal of the fourth flip-flop; and a fifth logic gate for performing a NOR operation on an output signal of the fifth flip-flop and an output signal of the second inverter to generate a test operation control signal.

In one embodiment, the row and column test operation control signal generator comprises: a third inverter for inverting the test mode selection signal; a sixth logic gate for performing an AND operation on the test operation control signal and the test mode selection signal; and a seventh logic gate for performing an AND operation on the test operation control signal and an output signal of the third inverter.

In one embodiment, the operation mode selection signal enables a precharge operation to be performed.

In one embodiment, the command decoder decodes command signals for requesting the precharge operation to generate the operation mode selection signal enabling the precharge operation to be performed.

In one embodiment, the semiconductor memory device further comprises: a fuse controller for programming row addresses and column addresses of the defective regular cells, and for generating the row repair signal and row fuse signals when addresses indicated by the address signals match the programmed row addresses, and generating the column repair signal and column fuse signals when the addresses indicated by the address signals match the programmed column addresses; and a switch for transmitting the address signals or the row fuse signals in response to the row test operation control signal and transmitting the address signals or the column fuse signals in response to the column test operation control signal.

In one embodiment, the row redundancy decoder further comprises a function of decoding the row fuse signals to select the first redundancy cells in response to the row repair signal.

In one embodiment, the column redundancy decoder comprises a function of decoding the column fuse signals to select the second redundancy cells in response to the column repair signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be described more fully hereinafter with reference to the accompanying drawings, in which exemplary embodiments of the invention are shown.

Figure 2:
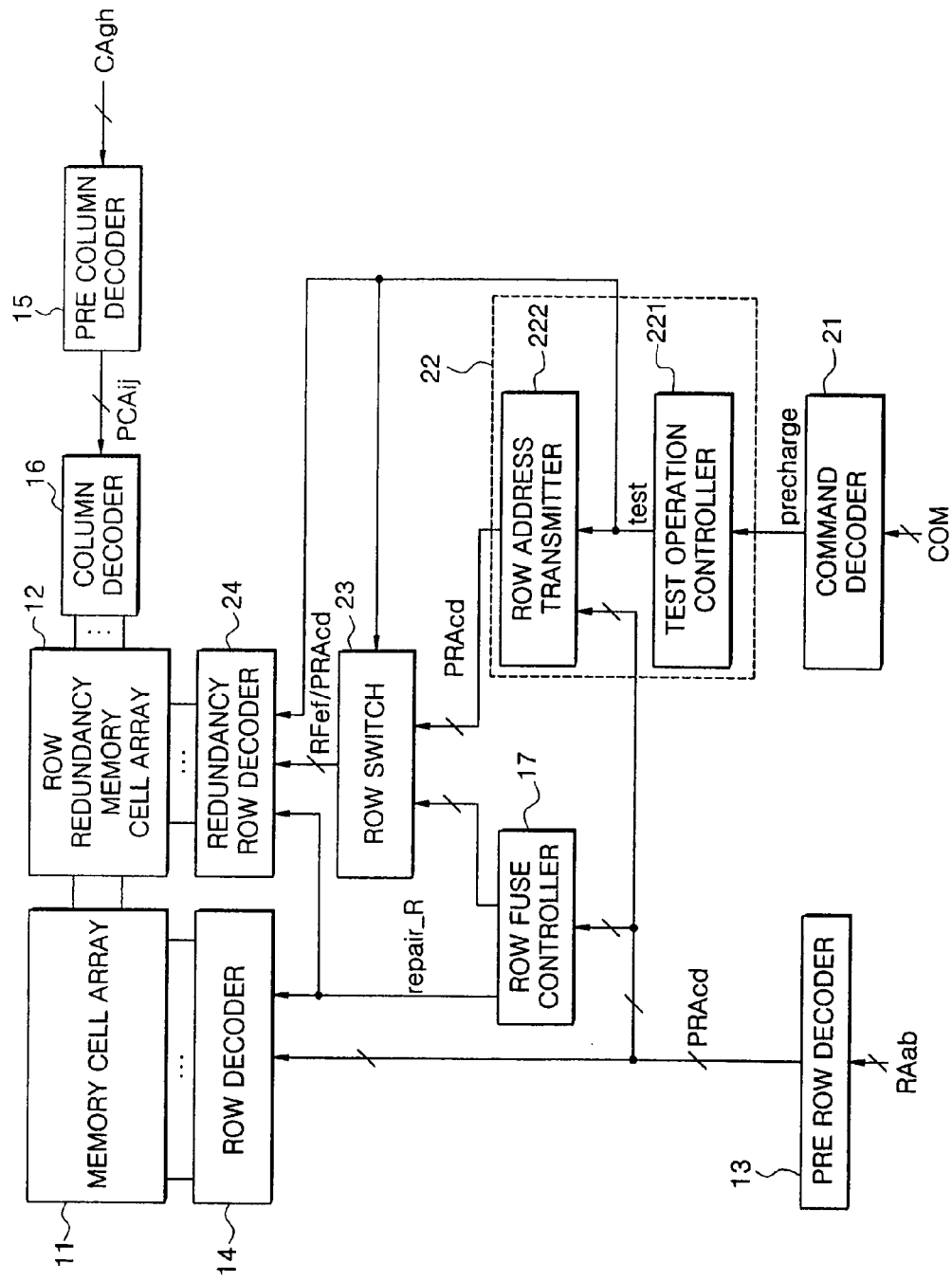
FIG. 2 contains a schematic block diagram which illustrates the configuration of a semiconductor memory device according to an exemplary embodiment of the present invention.

FIG. 2 illustrates the configuration of a semiconductor memory device according to an exemplary embodiment of the present invention.

Figure 1:
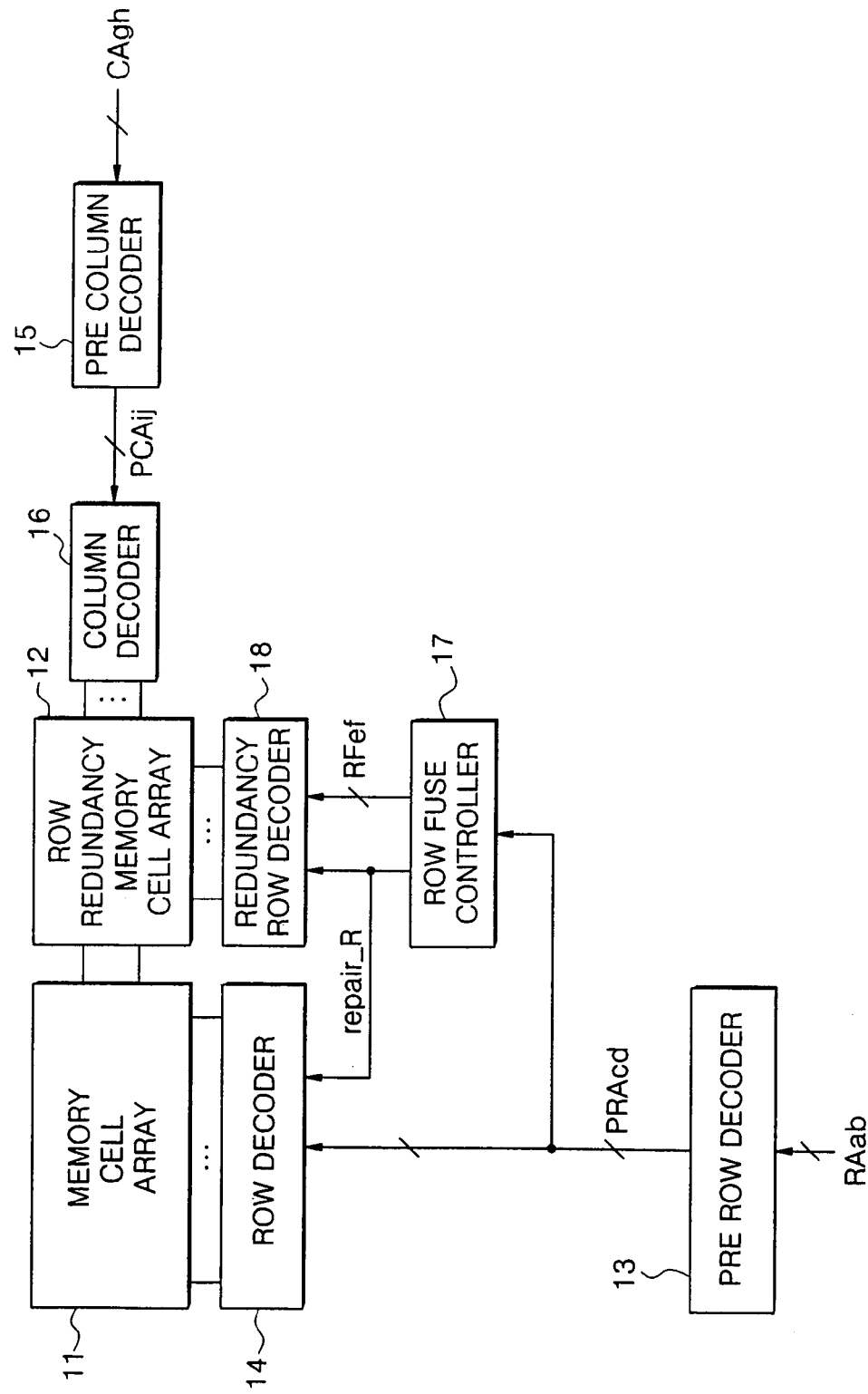
FIG. 1 contains a schematic block diagram which illustrates the configuration of a conventional semiconductor memory device.

Referring to FIG. 2, the semiconductor memory device, in comparison to the device of FIG. 1, additionally includes a command decoder 21, a row redundancy cell test controller 22, a row switch 23, and a redundancy row decoder 24, in addition to the memory cell array 11, the row redundancy memory cell array 12, the pre row decoder 13, the row decoder 14, the pre column decoder 15, the column decoder 16, and the row fuse controller 17 of FIG. 1. The row redundancy cell test controller 22 includes a test operation controller 221 and a row address transmitter 222.

Components introduced earlier with reference to FIG. 1 and now reappearing in FIG. 2 are denoted by the same reference numerals and their detailed description will not be repeated.

The command decoder 21 decodes a plurality of external command signals COM to generate operation mode selection signals for selecting an operation mode of the semiconductor memory device. In particular, when receiving the external command signal COM for requesting a precharge operation, the command decoder 21 generates a precharge signal.

In this case, the command signals COM include a row address strobe /RAS signal, a column address strobe /CAS signal, a write enable /WE signal, and an output enable /OE signal, and contain information for controlling operation of the semiconductor memory device.

When the test operation controller 221 receives the precharge signal from the command decoder 21 twice consecutively, the test operation controller 221 determines that a test is requested and generates a test operation control signal test. When the precharge signal is received once more, the test operation controller 221 determines that test termination is requested, and terminates the generation of the test operation control signal test.

In a test operation, when the test operation control signal test is received, the row address transmitter 222 transmits pre-decoded row address signals PRAcd to the row switch 23.

In the test operation, the row switch 23 outputs pre-decoded row address signals PRAcd when the test operation control signal test is received, and outputs row fuse signals RFef when the test operation control signal test is not received.

In a repair operation, when the row repair signal repair_R and the row fuse signals RFef are received, the redundancy row decoder 24 decodes the row fuse signals RFef to generate word line enable signals for selecting a redundancy cell to be substituted for a defective cell. In the test operation, when the test operation control signal test and the pre-decoded row address signals PRAcd are received, the redundancy row decoder 24 decodes the pre-decoded row address signals PRAcd to generate word line enable signals for selecting a redundancy cell to be tested.

A redundancy cell test operation of the semiconductor memory device will now be described with reference to FIG. 2.

It is assumed that row addresses of defective cells are fuse-programmed in the row fuse controller 17.

When external command signals COM requesting the precharge operation in order to request the test operation are received twice consecutively, the command decoder 21 generates a precharge signal precharge twice consecutively.

The test operation controller 221 generates the test operation control signal test in response to the precharge signal being input twice consecutively, and the row address transmitter 222 transmits the pre-decoded row address signals PRAcd to the row switch 23, and the row switch 23 sends the pre-decoded row address signals PRAcd to the redundancy row decoder 24.

In response to the test operation control signal test, the redundancy row decoder 24 decodes the pre-decoded row address signals PRAcd to generate word line enable signals for selecting redundancy cells to be tested.

The row redundancy memory cell array 12 then selects the redundancy cells to be tested in response to the word line enable signals of the redundancy row decoder 24 and the column selection signal of the column decoder 16, and applies electric stress to the selected redundancy cells or performs an active operation through the selected redundancy cells to test the selected redundancy cells.

That is, when command signals COM requesting the precharge operation are received twice consecutively, the semiconductor memory device selects the redundancy cells to be tested based on the pre-decoded row address signals PRAcd so that the redundancy cell test operation is performed.

When external command signals COM requesting the precharge operation in order to terminate testing the redundancy cells in predetermined time are received once more, the command decoder 21 generates the precharge signal precharge once more.

Then, the test operation controller 221 determines that termination of the test operation is requested, and ceases to generate the test operation control signal, and the row address transmitter 222 ceases to transmit the pre-decoded row address signals PRAcd and the row switch 23 sends the row fuse signals RFef to the redundancy row decoder 24.

In response to the row repair signal repair_R, the redundancy row decoder 24 decodes the row fuse signals RFef to select redundancy cells in the redundancy memory cell array 12.

If the row fuse controller 17 does not receive the pre-decoded row address signals PRAcd for selecting a row address of a defective cell and thus does not generate the row repair signal repair_R and the row fuse signals RFef for selecting a specific redundancy cell, the redundancy row decoder 24 is disabled and does not generate any signal.

In this manner, when the command signals COM requesting the precharge operation is input twice consecutively and then once more, the redundancy cell test of the present invention is disabled and the semiconductor memory device operates in the same manner as the conventional semiconductor memory device.

As described above, the semiconductor memory device of FIG. 2 allows for selecting arbitrary redundancy cells to be tested by changing-address information, as well as allowing for determining whether to perform test based on external command signals.

Figure 3:
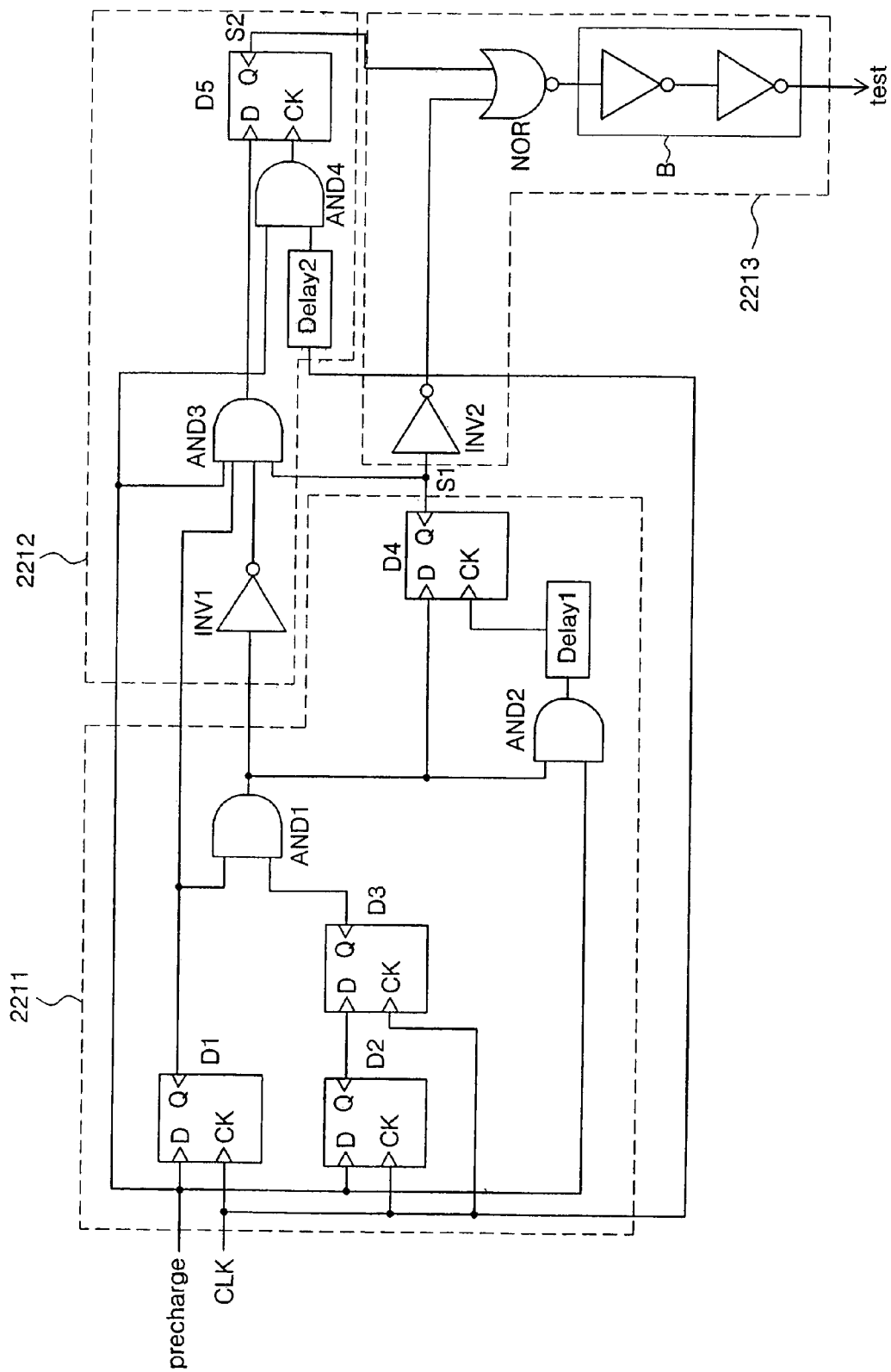
FIG. 3 is a detailed circuit diagram of a test operation controller of FIG. 2.

FIG. 3 is a detailed circuit diagram of the test operation controller of FIG. 2.

Referring to FIG. 3, the test operation controller 221 includes a test operation request sensing unit 2211 for generating a first signal S1 when sensing consecutive reception of a precharge signal, a test operation termination request sensing unit 2212 for generating a second signal S2 when sensing consecutive reception of the precharge signal and then one more reception of the precharge signal, and a test operation control signal generator 2213 for enabling a test operation control signal test in response to the first signal S1 and disabling the test operation control signal test in response to the second signal S2.

The test operation request sensing unit 2211 includes first and second D flip-flops D1 and D2 for outputting a precharge signal synchronized with a clock signal CLK, a third D flip-flop D3 for outputting an output signal of the second D flip-flop D2 synchronized with the clock signal CLK, a first AND gate AND1 for performing an AND operation on output signals of the first D flip-flop D1 and the third D flip-flop D3, a first inverter INV1 for inverting an output signal of the first AND gate AND1, a second AND gate AND2 for performing an AND operation on an output signal of the first AND gate AND1 and a precharge signal, first delay means Delay1 for delaying an output signal of the second AND gate AND2, and a fourth D flip-flop D4 for outputting the output signal of the first AND gate AND1 synchronized with an output signal of the first delay means Delay1. In this case, an output signal of the fourth D flip-flop D4 becomes a first signal S1.

The test operation termination request sensing unit 2212 includes a third AND gate AND3 for performing an AND operation on the precharge signal precharge, the output signal of the first D flip-flop D1, the output signal of the first inverter INV1, and the output signal of the fourth D flip-flop D4, second delay means Delay2 for delaying the clock signal CLK, a fourth AND gate AND4 for performing an AND operation on the precharge signal precharge and the output signal of the second delay means Delay2, and a fifth D flip-flop D5 for outputting the output signal of the third AND gate AND3 synchronized with the output signal of the fourth AND gate AND4. In this case, an output signal of the fifth D flip-flop D5 becomes a second signal S2.

The test operation control signal generator 2213 includes a second inverter INV2 for inverting the first signal S1 from the test operation request sensing unit 2211, a NOR gate NOR for performing a NOR operation on the first inverted signal S1 from the test operation request sensing unit 2211 and the second signal S2 from the test operation termination request sensing unit 2212, and a buffer B for buffering an output signal of the NOR gate NOR to generate a test operation control signal test.

Figure 4:
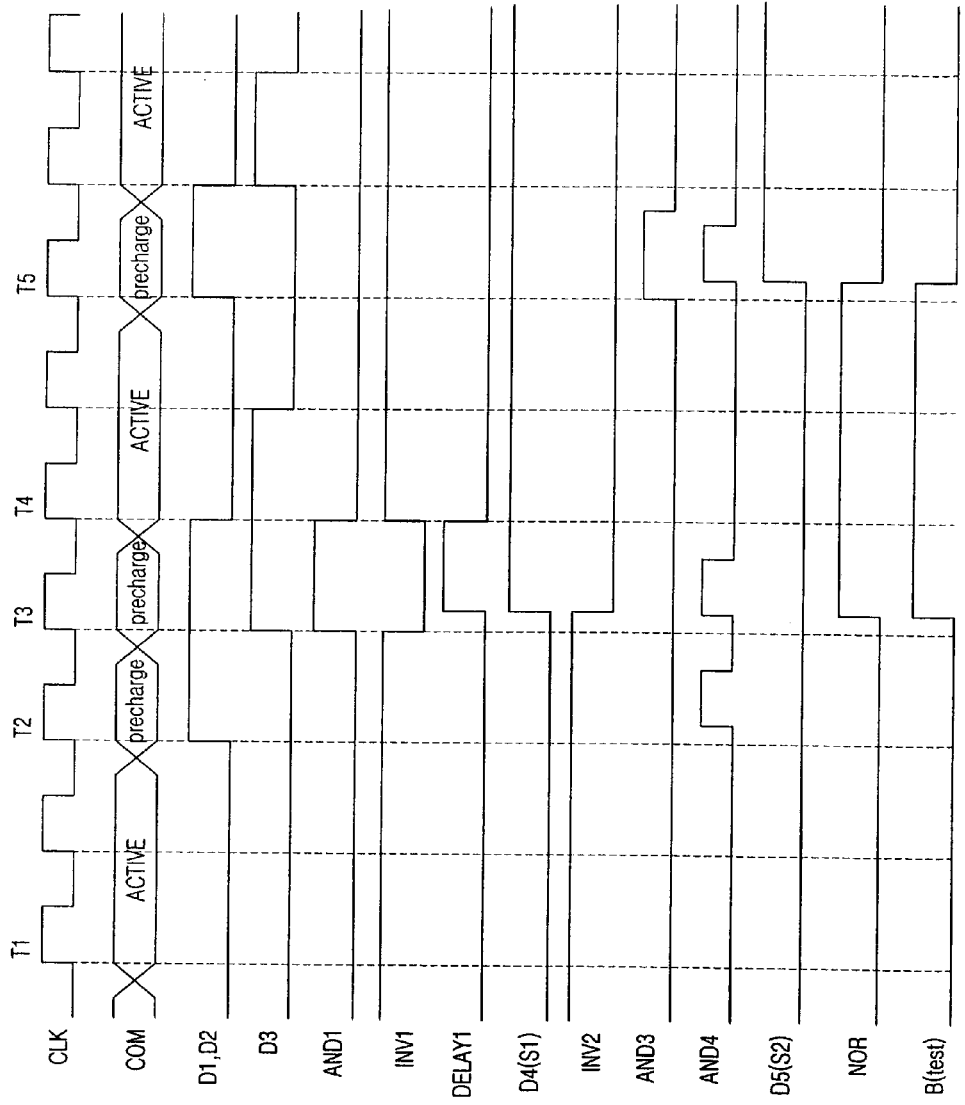
FIG. 4 is a signal timing diagram of the test operation controller of FIGS. 2 and 3.

Operation of the test operation controller of FIG. 3 will be now described with reference to FIG. 4.

It is assumed that the precharge signal precharge is at a high level when enabled and at a low level when disabled, the test operation control signal test is at a high level when enabled and at a low level when disabled, and the first to fifth D flip-flops D1 to D5 generate a low signal L when initialized.

When, at T1, command signals COM requesting active operation are input and the precharge signal precharge is disabled, the first to third D flip-flops D1, D2 and D3 are synchronized with the clock signal CLK and output a precharge signal at a low level.

The first AND gate AND1 generates a low signal L, the second AND gate AND2 generates a low signal L in response to the low signal L of the first AND gate AND1, the fourth D flip-flop D4 outputs a low signal L while keeping an initialization state, and the second inverter INV2 generates a high signal H.

In response to the high signal H from the second inverter INV2, the NOR gate NOR unconditionally generates a low signal L irrespective of the state of the output signal of the fifth D flip-flop D5. The buffer B buffers the NOR gate NOR to generate a test operation control signal test at a low level L.

That is, when receiving the command signals COM requesting the active operation, the test operation controller disables the test operation control signal test.

When, at T2, the command signals COM requesting the precharge signal operation is input and the precharge signal precharge is enabled, the first and second D flip-flops D1 and D2 are synchronized with the clock signal CLK and outputs the precharge signal at a high level, and the third D flip-flop D3 is synchronized with the clock signal CLK and outputs the low signal L from the second D flip-flop D2.

In response to the low signal L of the third D flip-flop D3, the first and second AND gates AND1 and AND2 continue to generate a low signal L, and the remaining circuits D4, INV2, INV1, AND3, AND4, D5, NOR, and B generate a test operation control signal test at a low level while keeping their previous state.

When, at T3, the command signals COM requesting a precharge operation are consecutively input and the precharge signal precharge is consecutively enabled, the first to third D flip-flops D1 to D3 are synchronized with the clock signal CLK and output a precharge signal at a high level.

The first AND gate AND1 generates a high signal H, the first inverter INV1 generates a low signal L, the second AND gate AND2 generates a high signal H that is delayed from the output signal of the first AND gate AND1 by a predetermined time.

The fourth D flip-flop D4 is synchronized with the high signal H from the second AND gate AND2 and outputs a high signal H of the first AND gate AND1, and the second inverter INV2 outputs a low signal L.

At the same time, the third AND gate AND3 outputs a low signal L, the fourth AND gate AND4 generates a pulse signal that is delayed from the clock signal CLK by a predetermined time, and the fifth D flip-flop D5 is synchronized with the pulse signal from the fourth AND gate AND4 and outputs a low signal L of the third AND gate AND3.

The NOR gate NOR performs a NOR operation on the low signal L from the second inverter INV2 and the low signal L from the fifth D flip-flop D5 to generate a high signal H. The buffer B buffers the high signal H to generate a test operation control signal test at a high level.

That is, the test operation controller enables the test operation control signal test when the command signals COM requesting the precharge operation are received twice consecutively.

When the command signals COM requesting the active operation are re-input at T4, the first and second D flip-flops D1 and D2 output the precharge signal precharge at a low level again and the first and second AND gates AND1 and AND2 generate a low signal L again. The third AND gate AND3 and the fourth AND gate AND4 generate a low signal L again.

However, the fourth D flip-flop D4 continues to output a high signal since it does not receive a signal having a rising edge from the second AND gate AND2. Likewise, the fifth D flip-flop D5 continues to output a low signal L since it does not receive a signal having a rising edge from the fourth AND gate AND4. Accordingly, the NOR gate NOR and the buffer B also continue to generate the test operation control signal at a high level H.

That is, it can be seen that even when the test operation control signal test is enabled and then the command signals COM requesting the active operation are input, the test operation control signal test is kept enabled.

When, at T5, the command signals COM requesting precharge operation are input once more and the precharge signal is enabled once more, the first and second D flip-flops D1 and D2 are synchronized with the clock signal CLK and output a precharge signal at a high level, and the third D flip-flop D3 is synchronized with the clock signal CLK and outputs a low signal L of the second D flip-flop D2.

The first and second AND gates AND1 and AND2 continue to generate a low signal L, and the fourth D flip-flop D4 continues to generate a high signal H.

However, as the precharge signal precharge is enabled, the third AND gate AND3 receives an output signal H at a high level from the first D flip-flop D1, an output signal H at a high level from the first inverter INV1, and a precharge signal precharge at a high level from the fourth D flip-flop D4, and simultaneously receives a precharge signal precharge at a high level to generate a high signal H.

The fifth D flip-flop D5 is synchronized with a pulse signal from the fourth AND gate AND4 and outputs the high signal H of the third AND gate AND3. The NOR gate NOR generates a low signal L in response to the output signal H of the fifth D flip-flop D5, and the buffer B buffers the low signal L to generate a test operation control signal test at a low level. In other words, the test operation controller disables the test operation control signal test again.

That is, the test operation controller disables the test operation control signal test again when the command signals COM requesting the precharge operation are received twice consecutively and then received once more.

In this manner, the test operation controller according to the present invention selects whether to enable the test operation control signal test based on the precharge signal precharge.

Figure 5:
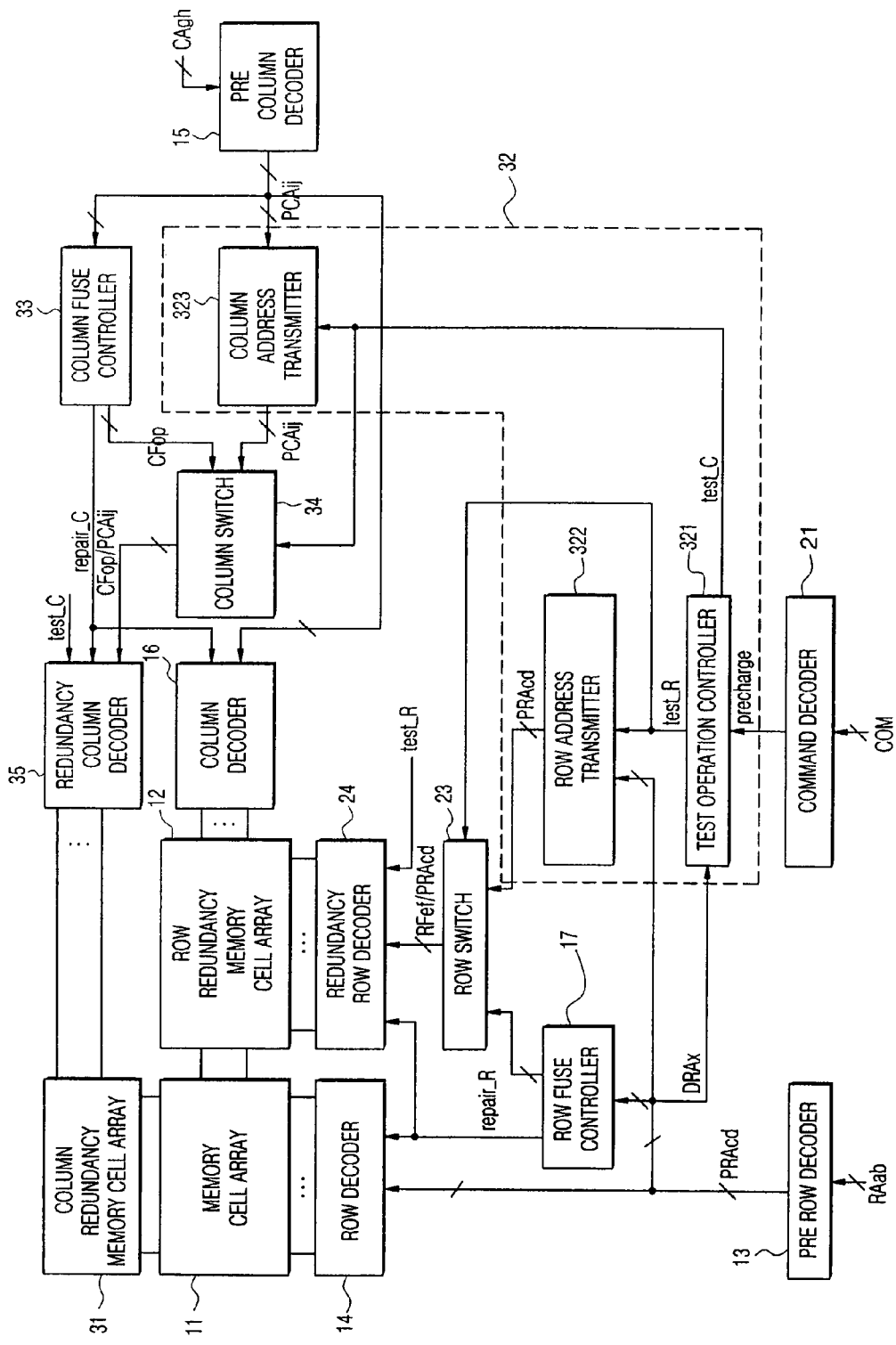
FIG. 5 contains a schematic block diagram which illustrates the configuration of a semiconductor memory device according to another exemplary embodiment of the present invention.

FIG. 5 illustrates the configuration of a semiconductor memory device according to another exemplary embodiment of the present invention.

Referring to FIG. 5, the semiconductor memory device includes a memory cell array 11, a row redundancy memory cell array 12, a pre row decoder 13, a row decoder 14, a pre column decoder 15, a column decoder 16, a row fuse controller 17, a command decoder 21, a row switch 23, and a redundancy row decoder 24, as in FIG. 2. The semiconductor memory device further includes a column redundancy memory cell array 31, a redundancy cell test controller 32, a column fuse controller 33, a column switch 34, and a redundancy column decoder 35. The redundancy cell test controller 32 includes a test operation controller 321, a row address transmitter 322, and a column address transmitter 323.

Accordingly, in the semiconductor memory device of FIG. 5, a redundancy cell is substituted for a defective cell according to a row address of the defective cell, and a redundancy cell is substituted for a defective cell according to the column address of the defective cell.

In FIG. 5, components denoted by the same reference numerals as in FIGS. 1 and 2 have the same configuration and operation as those earlier appearing components and their detailed description will not be repeated.

The column redundancy memory cell array 31 includes a plurality of redundancy cells corresponding to the plurality of regular cells in the memory cell array 11. Data is written/read to/from selected redundancy cells that are selected by word line enable signals from the row decoder 14 and the column selection signals from the redundancy column decoder 35.

The test operation controller 321 generates a row test operation control signal test_R or a column test operation control signal test_C in response to an output signal of the command decoder 21 and a test mode selection signal DRAx. That is, when the precharge signal precharge is received twice consecutively from the command decoder 21, the test operation controller 321 generates a row test operation control signal test_R at a first state of the test mode selection signal DRAx and a column test operation control signal test_C at a second state of the test mode selection signal DRAx. When the precharge signal is received once more, the test operation controller 321 determines that the test termination operation is requested and ceases to generate the row test operation control signal test_R or the column test operation control signal test_C.

In this case, the test mode selection signal DRAx is any one selected from the plurality of pre-decoded row address signals PRAcd and contains information for determining whether to test the redundancy cells in the row redundancy memory cell array 12 or the column redundancy memory cell array 31.

When the column test operation control signal test_C generated in the test operation of the semiconductor memory device is received, the column address transmitter 323 transmits the pre-decoded column address signals PCAij to the row switch 23.

The column fuse controller 33 programs a plurality of fuses therein according to column addresses of defective cells obtained in a wafer test and a post packaging test. When addresses indicated by the input pre-decoded column address signals PCAij match the programmed row addresses, the column fuse controller 33 generates a column repair signal repair_C enabling a repair operation by the redundancy column decoder 35 and column fuse signals CFop for selecting redundancy cells to be substituted for defective cells.

In this case, the plurality of fuses in the column fuse controller 33 may be implemented by laser beam-cut laser fuses or electrically cut electric fuses, in which the plurality of fuses are selectively cut to be programmed, similar to the row fuse controller 17.

When the column test operation control signal test_C generated in the test operation of the semiconductor memory device is received, the column switch 34 outputs the pre-decoded column address signals PCAij, and otherwise, outputs the column fuse signals CFop.

When the column repair signal repair_C and the column fuse signals CFop generated in the column repair operation are received, the redundancy column decoder 35 decodes the column fuse signals CFop to generate column selection signals for selecting redundancy cells to be substituted for defective cells. When the column test operation control signal test_C and the pre-decoded column address signals PCAij generated in the column test operation are received, the redundancy column decoder 35 decodes the pre-decoded column address signals PCAij to generate word line enable signals for selecting redundancy cells to be tested.

A redundancy cell testing operation in the semiconductor memory device of FIG. 5 will be now described.

It is assumed that row addresses of defective cells are fuse-programmed in the row fuse controller 17, column addresses of the defective cells are fuse-programmed in the column fuse controller 33, and the redundancy cells in the row redundancy memory cell array 12 are tested when the test mode selection signal DRAx is at a high level and redundancy cells in the column redundancy memory cell array 31 are tested when it is at a low level.

First, a test mode selection signal DRAx at a high level and external command signals COM requesting the precharge operation in order to request test operation are input twice consecutively in order to test the redundancy cells included in the row redundancy memory cell array 12.

The command decoder 21 then generates a precharge signal twice consecutively. The test operation controller 321 generates a row test operation control signal test_R in response to the precharge signal input twice consecutively and the phase of the test mode selection signal DRAx.

The row address transmitter 322 transmits the pre-decoded row address signals PRAcd to the row switch 23, the row switch 23 transmits the pre-decoded row address signals PRAcd to the redundancy row decoder 29 in response to the row test operation control signal test_R, and the redundancy row decoder 24 decodes the pre-decoded row address signals PRAcd to generate word line enable signals for selecting redundancy cells to be tested in response to the row test operation control signal test_R. The row redundancy memory cell array 12 selects redundancy cells to be tested in response to the word line enable signals from the redundancy row decoder 18 and the column selection signal from the column decoder 16.

The command signals COM requesting the precharge operation is input once more to terminate testing of the redundancy cells included in the row redundancy memory cell array 12.

The command decoder 21 generates the precharge signal precharge once more, and the test operation controller 321 terminates the generation of the row test operation control signal test_R to terminate the test operation in response to the precharge signal precharge.

Further, the test mode selection signal DRAx at a low level and the command signals COM requesting the precharge operation in order to request the test operation are input twice consecutively in order to test the redundancy cells included in the column redundancy memory cell array 31.

The command decoder 21 generates the precharge signal precharge twice consecutively, and the test operation controller 321 generates the column test operation control signal test_C in response to the precharge signal precharge input twice consecutively and the phase of the test mode selection signal DRAx.

The column address transmitter 323 transmits the pre-decoded column address signals PCAij to the column switch 34, the column switch 34 transmits the pre-decoded column address signals PCAij to the redundancy column decoder 35, and the redundancy column decoder 35 decodes the pre-decoded column address signals PCAij to generate column selection signals for selecting redundancy cells to be tested in response to the column test operation control signal test_C.

The column redundancy memory cell array 12 selects redundancy cells to be tested, which are included in the column redundancy memory cell array 31, in response to the column selection signals from the redundancy column decoder 35 and the word line enable signal from the row decoder 14.

Further, the command signals COM requesting the precharge operation are input once more to terminate testing the redundancy cells included in the column redundancy memory cell array 31.

The command decoder 21 then generates the precharge signal precharge once more, and in response to the precharge signal precharge, the test operation controller 321 terminates the generation of the column test operation control signals test_C to cease the test operation.

As described above, in the semiconductor memory device of FIG. 5, the determination is made as to whether to perform a test operation based on external command signals, and the type of the redundancy memory cell array is selected based on the phase of any decoded address signal.

Figure 6:
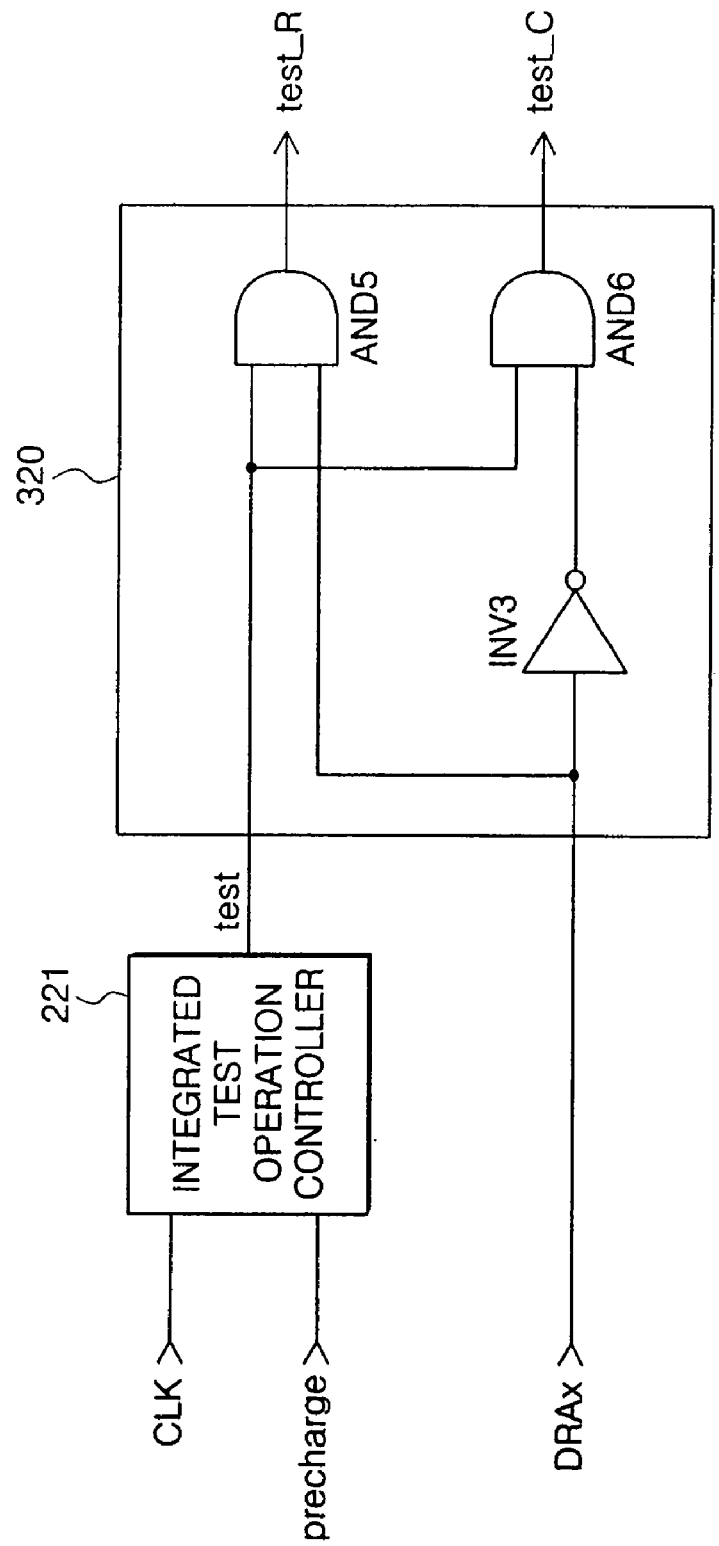
FIG. 6 is a detailed circuit diagram of a test operation controller of the semiconductor memory device of FIG. 5.

FIG. 6 illustrates a detailed circuit diagram of a test operation controller 321 in the semiconductor memory device of FIG. 5.

Referring to FIG. 6, the test operation controller 321 includes the test operation controller 221 of FIG. 3 as an integrated test operation for generating a test operation control signal test, and a row and column test operation controller 320 for generating a row test operation control signal test_R or a column test operation control signal test_C in response to the test operation control signal test and the test mode selection signal DRAx.

The row and column test operation controller 320 includes a fifth AND gate AND5 for performing an AND operation on the output signal test of the integrated test operation controller 221 and the test mode selection signal DRAx to generate a row test operation control signal test_R, a third inverter INV3 for inverting the test mode selection signal DRAx, and a sixth AND gate AND6 for performing an AND operation on the output signal test of the test operation controller 221 and the output signal of the third inverter INV3 to generate a column test operation control signal test_R.

In FIG. 6, since the integrated test operation controller 221 has the same configuration and operation as the test operation controller 221 of FIG. 3, its detailed description will not be repeated.

Operation of the test operation controller 321 will be now described with reference to FIG. 6.

It is assumed that the test operation control signal test, the row test operation control signal test_R, and the column test operation control signal test_C are at a high level when enabled and at a low level when disabled.

First, when the test operation control signal test is disabled, the fifth and sixth AND gates AND5 and AND6 of the row and column test operation controller 320 generate row and column test operation control signals test_R and test_C at a low level in response to the disabled test operation control signal test. That is, when the test operation control signal is disabled, the fifth and sixth AND gates AND5 and AND6 generate disabled row and column test operation control signals test_R and test_C.

When the test operation control signal test is enabled and the test mode selection signal DRAx at a low level is input, the fifth AND gate AND5 generates a row test operation control signal test_R at a low level, and the sixth AND gate AND6 generates a column test operation control signal test_R at a high level. When the test mode selection signal DRAx at a high level is input, the fifth AND gate AND5 generates the row test operation control signal test_R at a high level, and the sixth AND gate AND6 generates the column test operation control signal test_R at a low level.

When the test operation control signal test is enabled, the row and column test operation controller 320 enables one of the row test operation control signal test_R and the column test operation control signal test_C according to the phase of the test mode selection signal DRAx.

In this manner, the test operation controller of FIG. 6 not only selects whether to enable the test operation control signal based on the precharge signal precharge, but also selects the type of the redundancy memory cell array to be tested based on the phase of the test mode selection signal DRAx.

The semiconductor memory device of the present invention allows for selecting and testing all redundancy cells based on the external command signal and the address signal. Thus, it is possible to check all redundancy cells for defects in advance even after the semiconductor memory device is packaged, and to enable only non-defective redundancy cells to be substituted for defective cells. This increases the reliability of a repair operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
    a memory cell array including regular cells;
    a redundancy memory cell array including redundancy cells for substituting for defective regular cells;
    a command decoder for generating an operation mode selection signal in response to command signals;
    a redundancy cell test controller for generating a test operation control signal in response to the operation mode selection signal and for transmitting address signals in response to the operation mode selection signal, wherein the redundancy cell test controller comprises:
        a test operation controller for generating the test operation control signal when the same operation mode selection signal is consecutively received and terminating the generation of the test operation control signal when the same operation mode selection signal is received once more upon generating the test operation control signal; and
        an address signal transmitting unit for transmitting the address signals when the test operation control signal is received; and
    a redundancy decoder for decoding the address signals to select the redundancy cells in response to the test operation control signal.

2. The device according to claim 1, wherein the test operation controller comprises:
    a test operation request sensing unit for generating a first signal when consecutive reception of the same operation mode selection signal is sensed;
    a test operation termination request sensing unit for generating a second signal when the same operation mode selection signal is consecutively received and then sensing once more reception of the same operation mode selection signal; and
    a test operation control signal generator for generating the test operation control signal when the first signal is received and ceasing to generate the test operation control signal when the second signal is received.

3. The device according to claim 2, wherein the test operation request sensing unit comprises:
first and second flip-flops for outputting a first flip-flop output signal, the first output signal including the operation mode selection signal synchronized with a clock signal;
a third flip-flop for receiving the first flip-flop output signal from the second flip-flop, and outputting a second flip-flop output signal that includes the first flip-flop output signal synchronized with the clock signal;
a first logic gate for performing an AND operation on the first and second flip-flop, output signals of the first and third flip-flops, respectively;
a second logic gate for performing an AND operation on an output signal of the first logic gate and the operation mode selection signal;
first delay means for delaying an output signal of the second logic gate; and
a fourth flip-flop for outputting the output signal of the first logic gate synchronized with the output signal of the first delay means.

4. The device according to claim 3, wherein the test operation termination request sensing unit comprises:
a first inverter for inverting the output signal of the first logic gate;
a third logic gate for performing an AND operation on the operation mode selection signal, an output signal of the first flip-flop, an output signal of the first inverter, and an output signal of the fourth flip-flop;
second delay means for delaying the clock signal;
a fourth logic gate for performing an AND operation on the operation mode selection signal and an output signal of the second delay means; and
a fifth flip-flop for outputting an output signal of the third logic gate synchronized with an output signal of the fourth logic gate.

5. The device according to claim 4, wherein the test operation control signal generator comprises:
a second inverter for inverting the output signal of the fourth flip-flop; and
a fifth logic gate for performing a NOR operation on an output signal of the fifth flip-flop and an output signal of the second inverter to generate a test operation control signal.

6. The device according to claim 1, wherein the operation mode selection signal enables a precharge operation to be performed.

7. The device according to claim 6, wherein the command decoder decodes command signals for requesting the precharge operation to generate the operation mode selection signal enabling the precharge operation to be performed.

8. The device according to claim 1, wherein the semiconductor memory device comprises:
a fuse controller for programming addresses of the defective regular cells and generating a repair signal and fuse signals when addresses indicated by the address signals match the fuse-programmed addresses; and
a switch for transmitting the address signals or the fuse signals in response to the test operation control signal.

9. The device according to claim 8, wherein the redundancy decoder decodes the fuse signals to select the redundancy cells in response to the repair signal.

10. A semiconductor memory device comprising:
a memory cell array including regular cells;
a redundancy memory cell array including first and second redundancy cells for substituting for defective regular cells;
a command decoder for generating an operation mode selection signal in response to command signals;
a redundancy cell test controller for transmitting address signals in response to the operation mode selection signal and a test mode selection signal, when a row or column test operation control signal is generated, wherein the redundancy cell test controller comprises:
a test operation controller for generating the row test operation control signal or the column test operation control signal in response to the operation mode selection signal and the test mode selection signal, wherein the test operation controller comprises:
an integrated test operation controller for generating the test operation control signal when the same operation mode selection signal is consecutively received, and terminating generating the test operation control signal when the same operation mode selection signal is received once more upon generating the test operation control signal; and
a row and column test operation control signal generator for generating the row test operation control signal at a first state of the test mode selection signal and the column test operation control signal at a second state of the test mode
selection signal when the test operation control signal is generated, wherein the redundancy cell test controller further comprises:
a row address signal transmitting unit for transmitting the address signals in response to the row test operation control signal; and
a column address signal transmitting unit for transmitting the address signals in response to the column test operation control signal;
a row redundancy decoder for decoding the address signals to select the first redundancy cells in response to the row test operation control signal; and
a column redundancy decoder for decoding the address signals to select the second redundancy cells in response to the column test operation control signal.

11. The device according to claim 10, wherein the test mode selection signal is one of the address signals, and comprises information for selecting redundancy cells to be tested from the first and second redundancy cells.

12. The device according to claim 10, wherein the integrated test operation controller comprises:
a test operation request sensing unit for generating a first signal when consecutive reception of the same operation mode selection signal is sensed;
a test operation termination request sensing unit for generating a second signal when the same operation mode selection signal is consecutively received and then sensing once more reception of the same operation mode selection signal; and
a test operation control signal generator for generating the test operation control signal when the first signal is received and ceasing to generate the test operation control signal when the second signal is received.

13. The device according to claim 12, wherein the test operation request sensing unit comprises:
first and second flip-flops for outputting a first flip-flop output signal, the first output signal including the operation mode selection signal synchronized with a clock signal;

a third flip-flop for receiving the first flip-flop output signal from the second flip-flop, and outputting a second flip-flop output signal that includes the first flip-flop output signal synchronized with the clock signal;

a first logic gate for performing an AND operation on the first and second flip-flop output signals of the first and third flip-flops, respectively;

a second logic gate for performing an AND operation on an output signal of the first logic gate and the operation mode selection signal;

first delay means for delaying an output signal of the second logic gate; and a fourth flip-flop for outputting the output signal of the first logic gate synchronized with the output signal of the first delay means.

14. The device according to claim 13, wherein the test operation termination request sensing unit comprises:

a first inverter for inverting the output signal of the first logic gate;

a third logic gate for performing an AND operation on the operation mode selection signal, an output signal of the first flip-flop, an output signal of the first inverter, and an output signal of the fourth flip-flop;

second delay means for delaying the clock signal;

a fourth logic gate for performing an AND operation on the operation mode selection signal and an output signal of the second delay means; and a fifth flip-flop for outputting an output signal of the third logic gate synchronized with an output signal of the fourth logic gate.

15. The device according to claim 14, wherein the test operation control signal generator comprises:

a second inverter for inverting the output signal of the fourth flip-flop; and a fifth logic gate for performing a NOR operation on an output signal of the fifth flip-flop and an output signal of the second inverter to generate a test operation control signal.

16. The device according to claim 10, wherein the row and column test operation control signal generator comprises:

a third inverter for inverting the test mode selection signal;

a sixth logic gate for performing an AND operation on the test operation control signal and the test mode selection signal; and a seventh logic gate for performing an AND operation on the test operation control signal and an output signal of the third inverter.

17. The device according to claim 10, wherein the operation mode selection signal enables a precharge operation to be performed.

18. The device according to claim 17, wherein the command decoder decodes command signals for requesting the precharge operation to generate the operation mode selection signal enabling the precharge operation to be performed.

19. The device according to claim 17, wherein the semiconductor memory device further comprises:

a row fuse controller for programming row addresses of the defective regular cells, and for generating a row repair signal and row fuse signals when row addresses indicated by the address signals match the programmed row addresses;

a column fuse controller for generating column addresses of the defective regular cells, and for generating a column repair signal and column fuse signals when column addresses indicated by the address signals match the programmed column addresses;

a row switch for transmitting the address signals or the row fuse signals in response to the row test operation control signal and a column switch for transmitting the address signals or the column fuse signals in response to the column test operation control signal.

20. The device according to claim 19, wherein the row redundancy decoder decodes the row fuse signals to select the first redundancy cells in response to the row repair signal.

21. The device according to claim 19, wherein the column redundancy decoder decodes the column fuse signals to select the second redundancy cells in response to the column repair signal.

* * * * *

UNITED STATES PATENT AND TRADEMARK OFFICE
CERTIFICATE OF CORRECTION

PATENT NO. : 7,397,715 B2  Page 1 of 1
APPLICATION NO. : 11/450318
DATED : July 8, 2008
INVENTOR(S) : Jong-Hyoung Lim et al.

It is certified that error appears in the above-identified patent and that said Letters Patent is hereby corrected as shown below:

Column 15, line 14 delete ",".

Signed and Sealed this

Tenth Day of February, 2009

JOHN DOLL
*Acting Director of the United States Patent and Trademark Office*